United States Patent
Nettesheim et al.

(10) Patent No.: US 11,337,295 B2
(45) Date of Patent: May 17, 2022

(54) DEVICE AND COMPONENT FOR GENERATING A HIGH VOLTAGE OR HIGH FIELD STRENGTH

(71) Applicant: Relyon Plasma GmbH, Regensburg (DE)

(72) Inventors: Stefan Nettesheim, Regensburg (DE); Anatoly Shestakov, Regensburg (DE)

(73) Assignee: Relyon Plasma GmbH, Regensburg (DE)

( * ) Notice: Subject to any disclaimer, the term of this patent is extended or adjusted under 35 U.S.C. 154(b) by 7 days.

(21) Appl. No.: 16/822,874

(22) Filed: Mar. 18, 2020

(65) Prior Publication Data
US 2020/0305266 A1 Sep. 24, 2020

(30) Foreign Application Priority Data

Mar. 21, 2019 (DE) .......................... 102019107238.7

(51) Int. Cl.
*H05H 1/24* (2006.01)
*H01L 41/053* (2006.01)
*H01L 41/107* (2006.01)

(52) U.S. Cl.
CPC ....... *H05H 1/2475* (2013.01); *H01L 41/0533* (2013.01); *H01L 41/107* (2013.01); *H05H 1/2481* (2021.05)

(58) Field of Classification Search
USPC .................................................. 315/111.21
See application file for complete search history.

(56) References Cited

U.S. PATENT DOCUMENTS 2,830,274 A * 4/1958 Rosen ................ H02M 5/00
310/358
3,487,239 A * 12/1969 Schafft ................ H01L 41/107
310/359

(Continued)

FOREIGN PATENT DOCUMENTS

DE 3927406 2/1991
DE 60033247 8/2007

(Continued)

OTHER PUBLICATIONS

Andrew Benwell et al: "Flashover Prevention of High Voltage Piezoelectric Transformers by Thin Film Encapsulation", IEEE Transactions on Plasma Science, IEEE Service Center, Piscataway, NJ, US, Bd. 38, Nr. 12.

(Continued)

*Primary Examiner* — Srinivas Sathiraju
(74) *Attorney, Agent, or Firm* — Simpson & Simpson, PLLC

(57) ABSTRACT

An apparatus (100) for generating a high voltage or high field strength and a component (200) for generating a high voltage or high field strength are disclosed. A means (20) that is provided in a defined area (23) of the cylindrical and dielectric housing (11) or the sleeve (202) of the component (200). The means (20) ensures that, in a space (15) of the defined area (23), between the piezoelectric transformer (1) and an inner wall (14) of the dielectric housing (11), an essentially symmetrical field distribution (16) prevails. Even with an external influence (80), the field distribution (16) is influenced in such a way that an ignition field strength in space (15) of the defined area (23) is avoided.

18 Claims, 5 Drawing Sheets

(56) References Cited

U.S. PATENT DOCUMENTS

| | | | | |
|---|---|---|---|---|
| 3,662,194 | A * | 5/1972 | Moriki | H01L 41/0533 310/318 |
| 4,871,421 | A * | 10/1989 | Ogle | H01J 37/32174 438/710 |
| 6,333,589 | B1 * | 12/2001 | Inoi | H01L 41/053 310/358 |
| 6,362,559 | B1 * | 3/2002 | Boyd | H01L 41/107 310/359 |
| 6,366,006 | B1 * | 4/2002 | Boyd | H01L 41/107 310/359 |
| 6,472,610 | B1 * | 10/2002 | Kawabata | H01L 41/053 174/260 |
| 9,331,259 | B2 * | 5/2016 | Knowles | H02M 3/335 |
| 9,576,775 | B2 * | 2/2017 | Nettesheim | H05H 1/36 |
| 9,711,333 | B2 * | 7/2017 | Sieber | H01J 37/32082 |
| 9,788,404 | B2 * | 10/2017 | Nettesheim | H05H 1/24 |
| 10,004,914 | B2 * | 6/2018 | Nettesheim | A61F 13/00059 |
| 10,143,510 | B2 * | 12/2018 | Nettesheim | A61B 18/042 |
| 10,553,406 | B2 * | 2/2020 | Chang | H01J 37/32568 |
| 10,772,182 | B2 * | 9/2020 | Weilguni | H01L 41/044 |
| 10,904,995 | B2 * | 1/2021 | Nettesheim | H01L 41/107 |
| 10,966,309 | B2 * | 3/2021 | Pichler | H01L 41/053 |
| 2002/0149299 | A1 * | 10/2002 | Kim | H01L 41/187 310/358 |
| 2004/0201328 | A1 * | 10/2004 | Vazquez Carazo | H01L 41/107 310/359 |
| 2008/0211347 | A1 * | 9/2008 | Wright | H01H 59/0009 310/318 |
| 2008/0248435 | A1 * | 10/2008 | Clark | F23Q 3/002 431/264 |
| 2009/0122941 | A1 * | 5/2009 | Engemann | H01L 41/107 376/145 |
| 2015/0105716 | A1 * | 4/2015 | Ish-Yamini Tomer | A61N 1/44 604/23 |
| 2015/0287903 | A1 * | 10/2015 | Jeong | H01L 41/107 310/339 |
| 2016/0023183 | A1 * | 1/2016 | Levin | A61D 7/00 422/186 |
| 2016/0120016 | A1 * | 4/2016 | Kovaleski | H05G 1/10 378/122 |
| 2016/0329192 | A1 * | 11/2016 | Sieber | H05H 1/2475 |
| 2017/0310304 | A1 * | 10/2017 | Burak | H03H 9/64 |
| 2018/0040464 | A1 * | 2/2018 | Cooks | H01J 49/165 |
| 2018/0185957 | A1 * | 7/2018 | Swoboda | B23K 26/702 |
| 2018/0331277 | A1 * | 11/2018 | Dollgast | H01L 41/0471 |
| 2019/0180995 | A1 * | 6/2019 | Cooks | H01J 49/00 |
| 2019/0218131 | A1 * | 7/2019 | Swoboda | H01L 21/304 |
| 2019/0342985 | A1 * | 11/2019 | Dadheech | B62D 35/02 |
| 2020/0161096 | A1 * | 5/2020 | Chang | H01J 37/32091 |
| 2020/0305266 | A1 * | 9/2020 | Nettesheim | H01L 41/053 |
| 2020/0388538 | A1 * | 12/2020 | Swoboda | H01L 21/7813 |
| 2021/0197314 | A1 * | 7/2021 | Swoboda | H01L 21/7813 |
| 2021/0220500 | A1 * | 7/2021 | Lam | A23L 3/26 |

FOREIGN PATENT DOCUMENTS

| | | |
|---|---|---|
| DE | 102013100617 | 7/2014 |
| DE | 102014110405 A1 | 1/2016 |
| DE | 102016102585 A1 | 8/2017 |
| DE | 102017105410 | 9/2018 |
| DE | 102017105430 | 9/2018 |
| DE | 212018000015 | 10/2018 |
| WO | 2007006298 | 1/2007 |
| WO | 2017207654 A2 | 12/2017 |

OTHER PUBLICATIONS

Teranishi K et al: "A novel generation method of dielectric barrier discharge and ozone production using a piezoelectric transformer", Japanese Journal of Applied Physics, Japan Society of Applied Physics, JP, Bd. 43, Nr. 9B.

* cited by examiner

DEVICE AND COMPONENT FOR GENERATING A HIGH VOLTAGE OR HIGH FIELD STRENGTH

CROSS-REFERENCE TO RELATED APPLICATIONS

This application Claims priority from German Patent Application No. 10 2019 107 238.7, filed Mar. 21, 2019, which application is incorporated herein by reference in its entirety.

FIELD OF THE INVENTION

The present invention relates to a device for generating a high voltage or high field strength. The device includes a piezoelectric transformer that defines an input region and an output region. The piezoelectric transformer is surrounded along its longitudinal direction by a cylindrical, dielectric housing. Control electronics are provided to supply the piezoelectric transformer with AC voltage. With a contact on a first side surface of the input area and a contact on a second side surface of the input area of the piezoelectric transformer, the AC voltage is applied.

The present invention relates further to a component for generating a high voltage or high field strength.

BACKGROUND OF THE INVENTION

Electro-ceramic components, for example piezoelectric transformers (PT), are known from the prior art, for example from U.S. Pat. No. 2,830,274 from 1958 according to Charles A. Rosen. A piezoelectric transformer is an electromechanical resonance transformer that uses a combination of the inverse piezo effect (excitation) and direct piezo effect (voltage generation) to convert an input voltage with a given transformation ratio into an output voltage. Frequency and transmission ratio are determined by the dimensions and the electromechanical material properties. Typically, piezoelectric transformers are operated with an electrical driver module which applies electrical excitation in a suitable resonance mode. Areas of application are, for example, in the generation of a high voltage for the supply of fluorescent tubes. Piezoelectric transformers generate high electrical fields that are able to ionize gases through electrical excitation.

With the development of special ferroelectrics (e.g., lead zirconate titanate) and the layered structure as a multilayer, very high transmission ratios could be achieved, which could include spontaneous gas discharge on the high voltage side. This effect can, e.g., be used to build up efficient cold discharge sources, ozone generators and ionizers (see WO 2007/006298 A2 or H. Itoh, K. Teranishi and S. Suzuki, Plasma Sources, Sci. and Tech. 15 (2006) S51).

Ionization of the gases creates a piezoelectrically ignited micro-plasma. This process has properties that are comparable to a dielectric barrier discharge and as described, for example, in German patent DE 10 2013 100 617 B4. Here, a device for generating a plasma with a control circuit is disclosed. The control circuit is electrically connected to the excitation of a piezoelectric transformer. A handheld apparatus using the device is also disclosed. The piezoelectric transformer is made up of several layers. The control circuit is implemented on a circuit board and the piezoelectric transformer is held with a region of a first end above the circuit board. A high voltage is present at a second free end of the piezoelectric transformer, the plasma being generated at atmospheric pressure.

German patent application DE 10 2017 105 410 A1 relates to a plasma generator for generating non-thermal atmospheric pressure plasma with a piezoelectric transformer. The piezoelectric transformer is divided in the longitudinal direction into an input area and an output area. An AC voltage can be applied to the input area, the output area comprising a piezoelectric material which, when an AC voltage is applied to the input area, creates an electric field. The piezoelectric transformer has an end face on the output side, which faces away from the input area. The plasma generator is designed in such a way that a non-thermal atmospheric pressure plasma is ignited if enough power is applied to the input region of the piezoelectric transformer and a load is arranged in front of the output end face.

German patent application DE 10 2017 105 430 A1 relates to a device for generating a non-thermal atmospheric pressure plasma. A first housing is provided, in which a piezoelectric transformer is arranged. A control circuit is provided in a second housing and is designed to apply an input voltage to the piezoelectric transformer. Furthermore, an active space is disclosed which has the device and a dense gas volume or a leaky gas volume.

German patent application DE 39 27 408 A1 relates to a piezoceramic transformer. The piezoceramic with the electrodes is cast in a housing made of silicone rubber casting compound with a Shore hardness of 40. The housing is provided with devices for fastening the piezo transformer.

The registered utility model DE 21 2018 000 015 U1 discloses a device for generating a non-thermal atmospheric pressure plasma. The device has a first housing in which a piezoelectric transformer is arranged and a second housing in which a control circuit is arranged. The control circuit is designed to apply an input voltage to the piezoelectric transformer, the first housing having a coating to destroy an irritant gas.

U.S. published patent application US 2016/0120016 A1 discloses a low-power, compact piezoelectric particle emitter for emitting particles such as X-rays and neutrons. A piezoelectric transformer crystal receives an input voltage at an input end and generates a higher output voltage at an output electrode disposed at an output end. The emitter is in a vacuum and the output voltage creates an electric field. A charged particle source is positioned relative a target such that charged particles from the charged particle source are accelerated by the electric field toward the target. Interaction between the accelerated charged particles and the target causes one of X-rays and neutrons to be emitted.

European patent application EP 1 056 162 A1 discloses a device for controlling an electric field at, for example, a connection, a termination, or a joint of a high-voltage cable. The capacitive field control comprising a plurality of capacitive layers arranged substantially concentrically between an inner live conductor and an outer ground potential. The geometrical field control, comprising a stress cone which is arranged in contact with said ground potential.

It is also known that piezoelectric transformers deliver a very high voltage swing (transmission ratio) and are excellently suited to generate electrical AC voltages with a high amplitude at low cost and with little effort. In addition, such piezoelectric transformers can also be used to ignite a direct electrical gas discharge on the high voltage side. Various technical difficulties arise in all cases, as described below. The mechanical vibration of the electromechanical transducer must neither be strongly damped nor hindered, since otherwise the quality and efficiency of the conversion decrease and the component or the device with the piezoelectric transformer can be damaged. The power loss must also be dissipated from the vibrating component. Furthermore, the excitation part must be securely linked to the excitation signal. In addition, it is desirable that the component or the device with the piezoelectric transformer is protected from environmental influences, such as moisture, dirt, etc., and is decoupled from external mechanical impacts.

Another problem is represented by parasitic discharges which ignite uncontrollably from the high-voltage zone of the electro-ceramic component, for example a piezoelectric transformer, against the housing of the device with the electro-ceramic component or other objects in the vicinity of the device.

SUMMARY OF THE INVENTION

It is the object of the invention to provide a device for generating a high voltage or high field strength, wherein the piezoelectric transformer of the device having a high transmission ratio, high efficiency and at the same time being protected against partial discharges and thus having a long service life.

The above object is achieved by a device for generating a high voltage or high field strength comprises a piezoelectric transformer which has an input area and an output area. The piezoelectric transformer is surrounded along its longitudinal direction by a cylindrical, dielectric housing. An electronic control unit is connected to a contact on a first side surface of the input area and to a contact on a second side surface of the input area via electrical lines to supply the piezoelectric transformer with AC voltage. The device comprises a means which is provided in a region of the cylindrical and dielectric housing, starting from an end face of the piezoelectric transformer on the output side. The means and the region, respectively extends at least partially in the longitudinal direction of the housing and along the output area of the piezoelectric transformer, respectively. The means is designed such that the end face of the piezoelectric transformer on the output side is covered. A substantially symmetrical field distribution is formed by the means in a space of the area between the piezoelectric transformer and an inner wall of the dielectric housing. The means has the effect that, in case of an external influence, the field distribution is influenced in such a way that an ignition field strength in the space of the area is avoided.

Another object of the invention is to provide a component for generating a high voltage or high field strength, the piezoelectric transformer of the component having a high transmission ratio, high efficiency and at the same time being protected against partial discharges, dirt deposition, mechanical stress and overheating and thus has a long service life.

The above object is achieved by a component for generating a high voltage or high field strength, which has a cylindrical sleeve made from dielectric material. A piezoelectric transformer is arranged concentrically in the axial direction inside the sleeve. A cap which is attached to an output end of the sleeve in such a way that an output side end face of the piezoelectric transformer bears on the cap. A further cap is attached to an input-side end of the sleeve in such a way that an input-side end face of the piezoelectric transformer bears on the further cap. An elastic element is provided in the cap and the further cap, wherein in both of which the piezoelectric transformer is held.

The different embodiments of the means have the advantage that harmful parasitic discharges, which can be caused by very large potential differences in the piezoelectric transformer in a small space, are avoided. These parasitic discharges can reduce the efficiency of the transformation process or even damage the piezoelectric component. A strongly asymmetrical field distribution also stresses the piezoelectric component and reduces the efficiency of the transformation. All of this can be prevented by the inventive means.

According to an embodiment of the invention, the means can be a cup-shaped cap. The cap includes a bottom and a radially peripheral edge. The floor covers the end face of the piezoelectric transformer on the output side. The radially circumferential edge of the cap extends in the direction of the longitudinal axis and thus along the area which is responsible for the symmetrical field distribution in the housing of the device.

According to the invention, the discharge occurs directly on the face side of the open end, that is to say at the front edge of the piezoelectric transformer. Due to the means, the piezoelectric transformer is no longer sensitive to lateral (radial) discharges or asymmetrical discharges.

According to an embodiment of the invention, the cup-shaped cap is attached to an output side face of the cylindrical housing such that the radially circumferential edge of the cap encloses the cylindrical housing in this area. The bottom of the cap lies opposite the output side face of the piezoelectric transformer. The cup-shaped cap closes the outlet end of the cylindrical housing. This has the advantage that there is an essentially symmetrical field distribution in the region of the cup-shaped cap, which cannot be influenced from the outside in such a way that ignition of a plasma occurs in the interior of the housing.

According to a further embodiment of the invention, a further cap can be attached to an input side end of the cylindrical housing. A radially circumferential edge of the further cap encloses the cylindrical housing and the bottom of the further cap covers an opposite end face of the piezoelectric transformer and lies opposite it, respectively. The further cap thus closes the input-side end of the cylindrical housing. The additional cap protects the piezoelectric transformer in the housing against dirt, touch and/or damage.

According to a possible embodiment of the invention, the means can have the form of the cup-shaped cap, which is attached to an outlet end of the cylindrical housing such that the radially circumferential edge of the cap is embedded in the region in the dielectric material of the cylindrical housing. The bottom of the cap then lies opposite the end face of the piezoelectric transformer on the output side face. The cup-shaped cap closes the output side end of the cylindrical housing.

According to a possible further embodiment of the invention, the means can comprise the cup-shaped cap and a plurality of capacitive elements which are embedded in the area of the material of the cylindrical housing. The cup-shaped cap is attached to an output side end of the cylindrical housing, so that the radially circumferential edge of the cap is embedded in the area in the dielectric material of the cylindrical housing. The bottom of the cap lies opposite to the output side face of the piezoelectric transformer. The cup-shaped cap closes the output side end of the cylindrical housing.

According to yet another possible embodiment of the invention, the means can comprise the cup-shaped cap and a plurality of resistive and/or capacitive fillers. The material of the cylindrical housing is filled in the area with the fillers. As in all embodiments, the cup-shaped cap is attached to the output side end of the cylindrical housing, so that the radially circumferential edge of the cap is embedded in the region in the dielectric material of the cylindrical housing. The bottom of the cap lies opposite the end face of the piezoelectric transformer on the output side. The cup-shaped cap closes the output side end of the cylindrical housing.

According to a likewise possible embodiment of the invention, the means can be the cup-shaped cap, which is attached to an output-side end of the cylindrical housing such that the radially circumferential edge of the cap is embedded in the area in the dielectric material of the cylindrical housing. The radially circumferential edge is opened out, starting from the bottom, and the bottom of the cap can be coupled to the end face of the piezoelectric transformer on the output side via a permanently elastic element. The cup-shaped cap closes the outlet end of the cylindrical housing.

According to a possible embodiment of the invention, the cylindrical housing can have a conductive covering or cladding on an outer wall, at least in the entrance area. The covering or cladding is connected to ground potential.

According to a preferred embodiment, due to the high voltage or high field strength, a plasma is formed after the means, which follows the end face of the piezoelectric transformer on the output side. The plasma is formed outside of the cylindrical and dielectric housing.

The peculiarity of the piezoelectric transformer is that a continuously increasing potential amplitude (in relation to ground potential) builds up in the axial direction inside the housing. The piezoelectric transformer is robust against symmetrical partial discharges in the axial direction. The symmetrical partial discharges are even desirable in the case of using the piezoelectric transformer as cold discharge sources. In this case, a discharge occurs directly at the frontal open end of the piezoelectric transformer. However, the piezoelectric transformer is very sensitive to lateral (radial) discharges or asymmetrical discharges.

Even during installation in a housing, the mounting of the piezoelectric transformer or traces of dust or dirt on the surface of the piezoelectric transformer can ignite such harmful parasitic discharges and damage the piezoelectric transformer by electromechanical breakage. All of this can be prevented by the component according to the invention.

The component according to the invention is used to generate a high voltage or high field strength. The piezoelectric transformer is inserted in a cylindrical, dielectric sleeve. The piezoelectric transformer is arranged concentrically in the sleeve in the axial direction. A cap is attached to an output side end of the sleeve such that an output side end face of the piezoelectric transformer bears against the cap. Another cap is attached to an input side end of the sleeve such that an input side end face of the piezoelectric transformer bears against the additional cap. A permanently elastic element is provided in the cap and the further cap, in which the piezoelectric transformer is supported.

The piezoelectric transformer is completely enclosed in the sleeve by the cap and the additional cap. The piezoelectric transformer is thus protected against dust or dirt on the surface of the piezoelectric transformer. Since the piezoelectric transformer is an electromechanical vibrating component, the piezoelectric transformer must be mounted in a suitable manner so that the vibration is not mechanically, excessively disturbed or damped. For this purpose, the permanently elastic elements are provided in the cap and the further cap. The mechanical suspension or holder can be combined with the electrical field control. The cooling of the piezoelectric transformer can, for example be optimized with metallic caps.

The component has two electrical lines which are connected to each contact of the piezoelectric transformer. The electrical lines are led through the dielectric sleeve of the component to the contact.

The dielectric sleeve has, on both sides, a radially circumferential shoulder on which the cap or the further cap rests. A defined positioning of the cap or of the further cap on the sleeve can thus be provided by the shoulders. This has the advantage that the piezoelectric transformer is held securely and in a defined manner in the sleeve of the component. There is also no damage to the piezoelectric transformer during assembly of the component.

At least one passage is formed in the dielectric sleeve, through which a pressure, temperature or humidity compensation can be carried out. The at least one passage is designed in such a way that dirt or foreign bodies cannot penetrate into the casing from the outside.

According to a preferred embodiment of the inventive component, a plasma can be formed after the cap, which follows at the output end of the sleeve and on the outlet end face of the piezoelectric transformer, outside the cylindrical and dielectric sleeve.

Various solutions for optimizing field distribution through field control measures are also known in high-voltage technology. The targeted field control typically serves to lower the local electrical field strengths to such an extent that the electrical strengths of the insulating materials, air gaps and the interfaces are not exceeded until to the electrical breakdown.

Depending on the system and type of voltage (direct or alternating voltage), various methods are available for defusing the field distribution. It can, for example, a geometric control can be achieved by shaping electrode contours. Capacitive control can be achieved by using conductive control pads with a capacitively determined voltage distribution for AC voltages. Refractive control can be achieved by using high-permittivity dielectric insulating materials at AC voltages. Resistive control can be achieved with conductive pads for DC and AC voltages.

The peculiarity of the piezoelectric transformer is that a continuously increasing potential amplitude (in relation to earth potential) builds up in the axial direction. The piezoelectric transformer is robust with respect to symmetrical partial discharges in the axial direction and this may even be desirable as a cold discharge source if the piezoelectric transformer is used. In this case, a discharge occurs directly at the open end of the piezoelectric transformer. However, the piezoelectric transformer is very sensitive to lateral (radial) discharges or asymmetrical discharges.

It has now surprisingly been observed that if a means for field control is provided on the high-voltage side of the component or the device, the means completely stabilizes the component or the device with high efficiency. The advantage is that a slight parasitic tendency to ignite occurs in the radial direction in the component or the device. There is also a slight dependence on the electrical environment. There is a symmetrical field distribution between the piezoelectric transformer and the inner wall of the housing or the shell. Finally, according to the invention, the dielectric losses and capacitive load over the surface of the component are minimized.

BRIEF DESCRIPTION OF THE DRAWINGS

In the following, exemplary embodiments are intended to explain the invention and its advantages with reference to the attached figures. The size relationships in the figures do not always correspond to the real size relationships, since some shapes are simplified, and other shapes are shown enlarged in relation to other elements for better illustration. Reference is made to the accompanying drawings in which.

DETAILED DESCRIPTION OF EMBODIMENTS OF THE INVENTION

Figure 1:
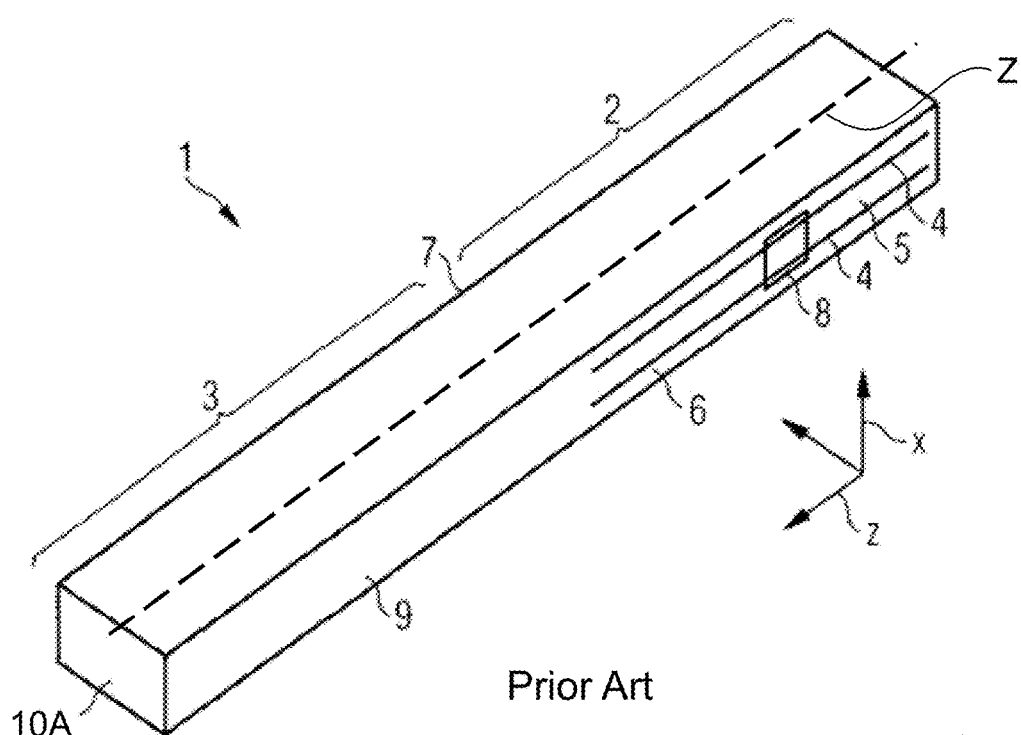
FIG. 1 shows a prior art piezoelectric transformer in a perspective view.

Identical reference numerals are used for identical or identically acting elements of the invention. Furthermore, for the sake of clarity, only reference numerals are shown in the individual figures which are necessary for the description of the respective figures.

FIG. 1 shows a piezoelectric transformer 1 in a perspective view. According to a possible embodiment, the piezoelectric transformer 1 can be used in a device for generating non-thermal atmospheric pressure plasma P. Although the description below relates to the generation of non-thermal atmospheric pressure plasma P in relation to the various embodiments, this should not be interpreted as a limitation of the invention. A high voltage or a high electric field can also be generated with the device 1 according to the invention or the component 200 (see FIG. 10-1) according to the invention. An AC voltage is considered to be a high voltage at a voltage of >1 kV, typically >3 kV and in many cases also >10 kV. A field strength >1 kV/mm is considered to be a large field strength.

A piezoelectric transformer 1 is a design of a resonance transformer, which is based on piezoelectricity and, in contrast to the conventional magnetic transformers, represents an electromechanical system. The piezoelectric transformer 1 is, for example, a transformer of the Rosen-Type.

The piezoelectric transformer 1 has an input region 2 and an output region 3, the output region 3 adjoining the input region 2 in a longitudinal direction Z. In the input area 2, the piezoelectric transformer 1 has electrodes 4 to which an alternating voltage can be applied. The electrodes 4 extend in the longitudinal direction Z of the piezoelectric transformer 1. The electrodes 4 are alternately stacked with a piezoelectric material 5 in a stacking direction X which is perpendicular to the longitudinal direction Z. The piezoelectric material 5 is polarized in the stacking direction X.

The electrodes 4 are arranged in the interior of the piezoelectric transformer 1 and are also referred to as internal electrodes. The piezoelectric transformer 1 has a first side surface 6 and a second side surface 7, which lies opposite the first side surface 6. A first outer electrode 8 is arranged on the first side surface 6. A second outer electrode 8 (not shown here) is arranged on the second side surface 7. The inner electrodes 4 are alternately electrically connected to one another in the stacking direction X, either with the first outer electrode 8 or the second outer electrode 8.

Figure 3:
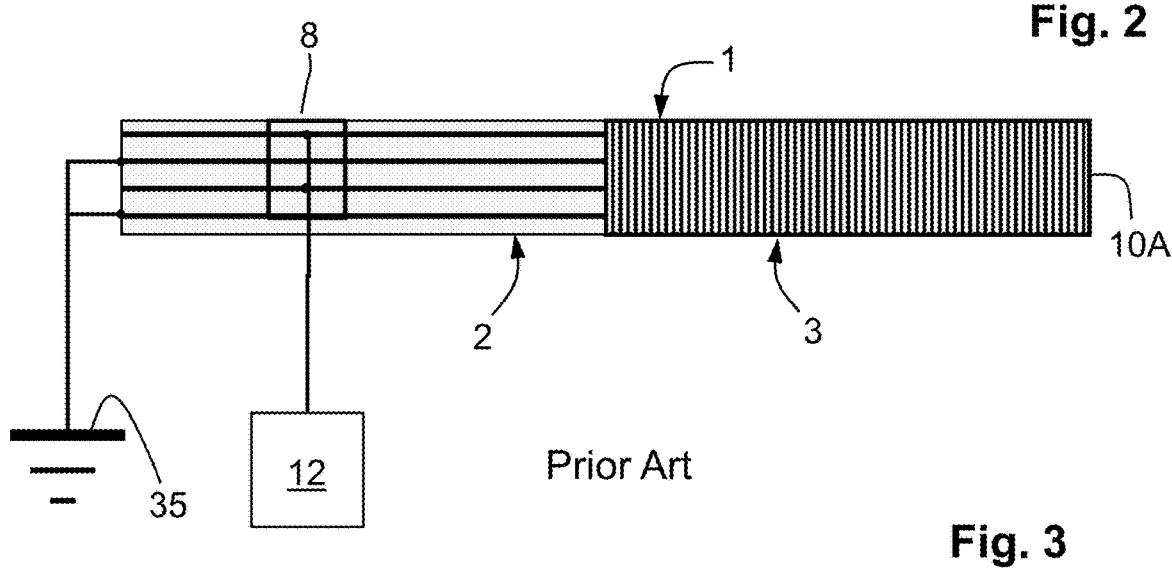
FIG. 3 is a schematic representation of a conventional wiring of the piezoelectric transformer.

FIG. 3 shows a schematic representation of a conventional circuit for the piezoelectric transformer 1. The input area 2 can be controlled with a low alternating voltage by means of control electronics 12 which is applied between the electrodes 4 (see FIG. 1) of the input area 2. Due to the piezoelectric effect, the AC voltage applied on the input side is first converted into a mechanical vibration. The frequency of the mechanical vibration is essentially dependent on the geometry, the mechanical structure and the material of the piezoelectric transformer 1. The input region 2 of the piezoelectric transformer 1 is connected to the ground potential 35.

The output region 3 is of a piezoelectric material 9 and is free of internal electrodes 4. The piezoelectric material 9 in the output region 3 is polarized in the longitudinal direction Z. The piezoelectric material 9 of the output region 3 can be the same material as the piezoelectric material 5 of the input region 2. It is possible as well that the piezoelectric materials 5 and 9 differ in their direction of polarization. In the output region 3, the piezoelectric material 9 is shaped into a single monolithic layer which is polarized completely in the longitudinal direction Z. The piezoelectric material 9 has only a single polarization direction in the output region 3.

Figure 2:
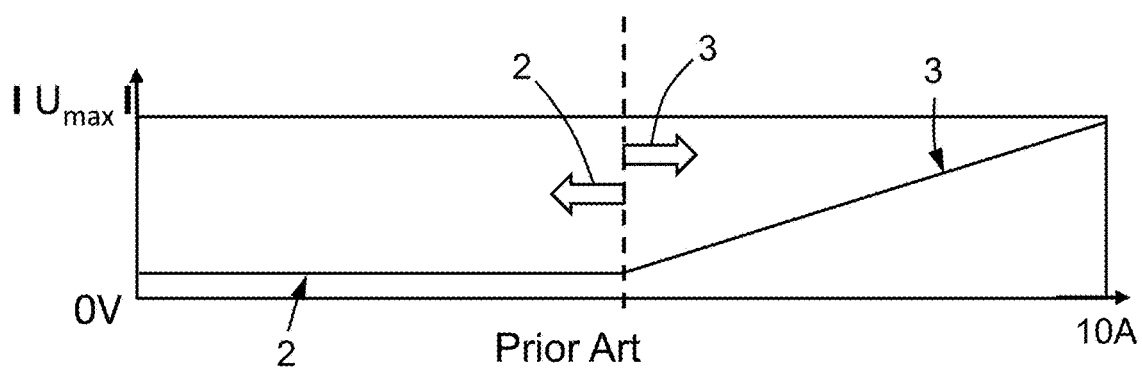
FIG. 2 is a graphic representation of the formation of the high voltage on the output end face of the piezoelectric transformer.

If an alternating voltage is applied to the electrodes 4 in the input region 2, a mechanical wave is formed within the piezoelectric material 5 and 9, which generates an output voltage due to the piezoelectric effect in the output region 3. FIG. 2 shows a graphic representation of the formation of the high voltage on the output side end face 10A of the output region 3 of the piezoelectric transformer 1. As can be seen from the illustration in FIG. 2, an electrical voltage is thus generated in the output region 3 which increases towards the output side end face 10A of the piezoelectric transformer 1. The electrical voltage is thus generated between the output side end face 10A and the end of the electrodes 4 of the input region 2. A high voltage is therefore present at the output side end face 10A. This also creates a high potential difference between the output-side end face 10A and the surroundings of the piezoelectric transformer 1, which is sufficient to generate a strong electric field that ionizes a process medium or the surrounding air. It is also possible to generate radicals, excited molecules or atoms in the plasma.

In this way, the piezoelectric transformer 1 generates a high electrical field that is able to ionize gases or liquids by electrical excitation. Atoms or molecules of the respective gas or liquid are ionized and form a plasma P. Ionization occurs whenever the electric field strength on the surface of the piezoelectric transformer 1 exceeds the ignition field strength of the plasma P. The ignition field strength of a plasma P is the field strength that is required to ionize the atoms or molecules or to generate radicals, excited molecules or atoms (not shown here).

Figure 4:
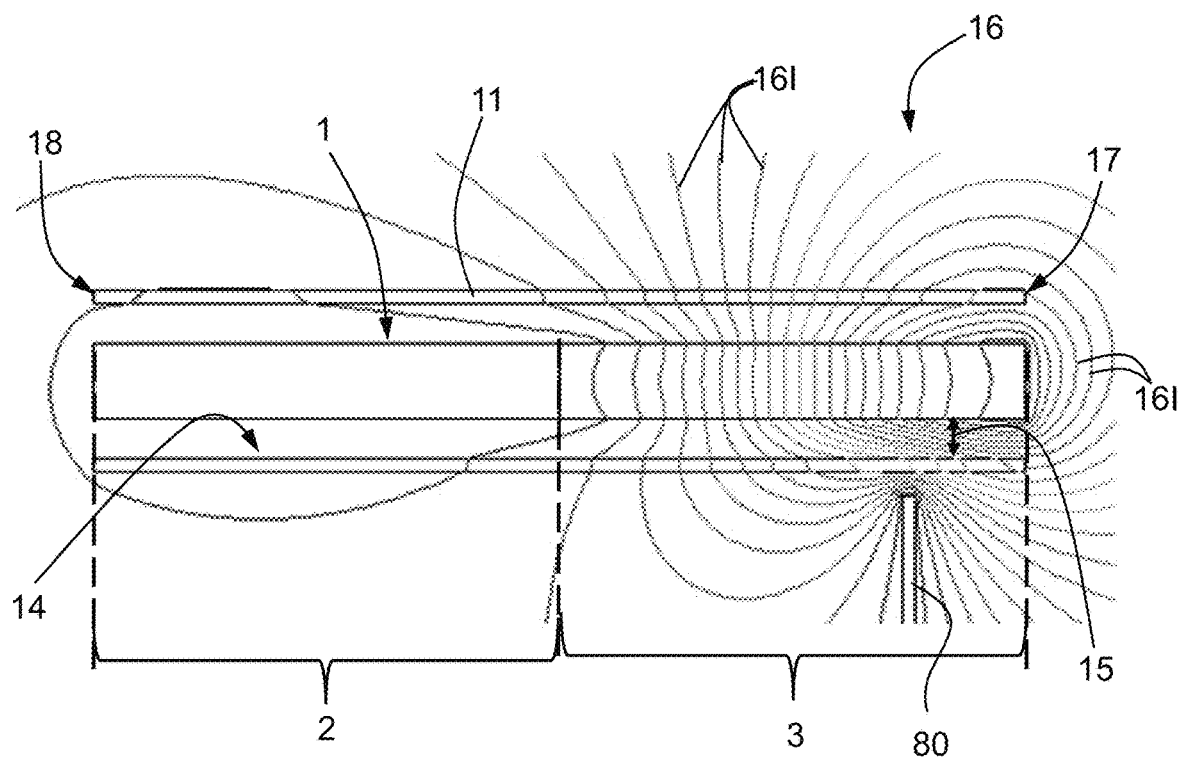
FIG. 4 is a schematic representation of the field distribution of the electric field caused by an external influence on the conventional arrangement of the piezoelectric transformer in a housing.

FIG. 4 shows a schematic representation of a field distribution 16 of isopotential lines 16I of the electric field with an external influence 80 on the conventional arrangement of the piezoelectric transformer 1. The piezoelectric transformer 1 is surrounded by a housing 11, the piezoelectric transformer 1, with the input region 2 and the output region 3, extends along its longitudinal direction L in the cylindrical, dielectric housing 11. In the conventional arrangement of the piezoelectric transformer 1, the external influence 80 influences the isopotential lines 16I in a space 15 between the piezoelectric transformer 1 and an inner wall 14 of the dielectric housing 11 in such a way that the distance between the isopotential lines 16I is reduced, which increases the risk there is that the ignition field strength is reached within space 15. The ignition of the plasma in space 15 can damage the piezoelectric transformer 1.

Figure 5:
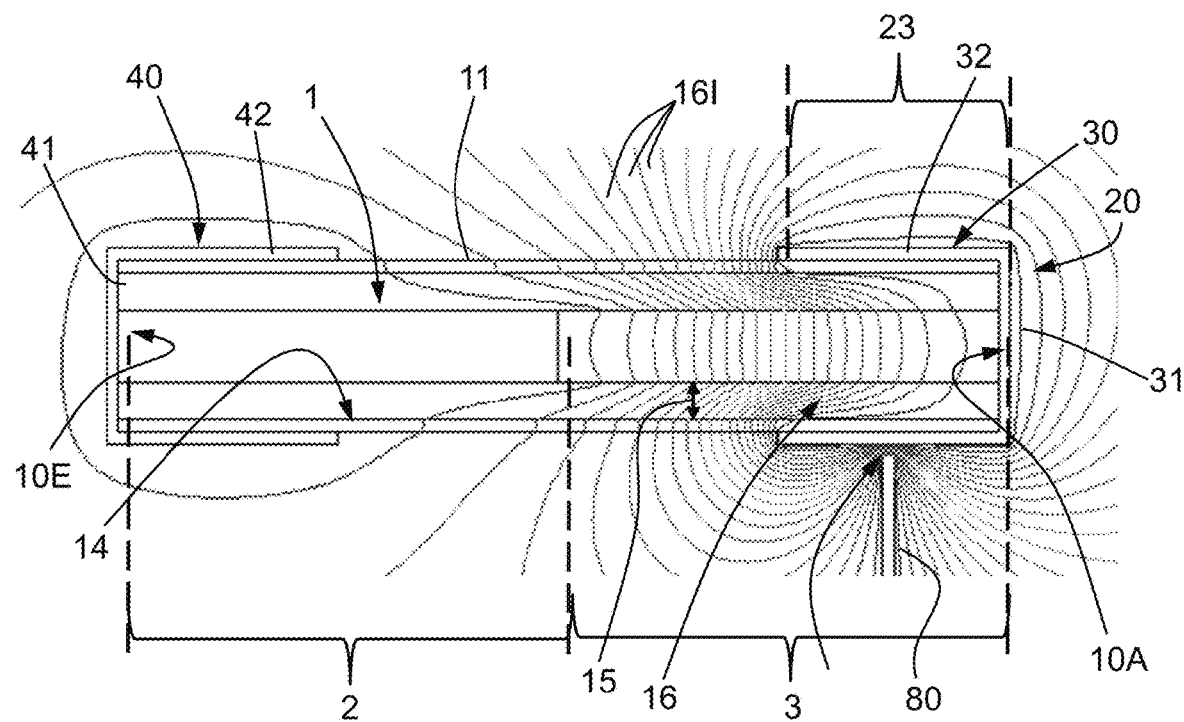
FIG. 5 is a schematic representation of the field distribution of the electric field caused by an external influence on the inventive arrangement of the piezoelectric transformer in a housing.

FIG. 5 shows a schematic representation of the field distribution 16 of the electrical field with an external influence 80 on the arrangement of the piezoelectric transformer 1 in the cylindrical housing 11. For this purpose, there is a means 20, which in the embodiment shown here is a cup-shaped cap 30, which is attached to an output side end 17 (see FIG. 4) of the cylindrical housing 11. The cap 30 is provided in a region 23 of the cylindrical and dielectric housing 11, which extends, at least partially, in the longitudinal direction L along the output region 3, starting from an output side end face 10A of the piezoelectric transformer 1 on the output side. The cap 30 consists of a base 31 which covers the output side end face 10A of the piezoelectric transformer 1 and a radially circumferential edge 32 which extends in the direction of the longitudinal axis L along the region 23.

For reasons of symmetry and to close the housing 11, a further cap 40 can be attached to an input side end 18 (see FIG. 4) of the cylindrical housing 11. The further cap 40 also has a radially circumferential edge 42 and a bottom 41. The bottom 41 of the further cap 40 lies opposite an input side end face 10E of the piezoelectric transformer 1. The further cap 40 closes the input end 18 of the cylindrical housing 11.

The illustration in FIG. 5 shows that an external influence 80, which is approximated to the housing 11 in the area 23, does not result in any compression of the isopotential lines 16I in the space 15 by the means 20, here the cap 30. The space 15 lies in the area 23 between the piezoelectric transformer 1 and an inner wall 14 of the dielectric housing 11. Outside the housing 11, the isopotential lines 16I are compressed by the external influence, so that the ignition field strength is reached there. Ignition of a plasma P in this area 23 does not have a disruptive effect on the piezoelectric transformer 1 in the interior of the housing (not shown here).

Figure 6:
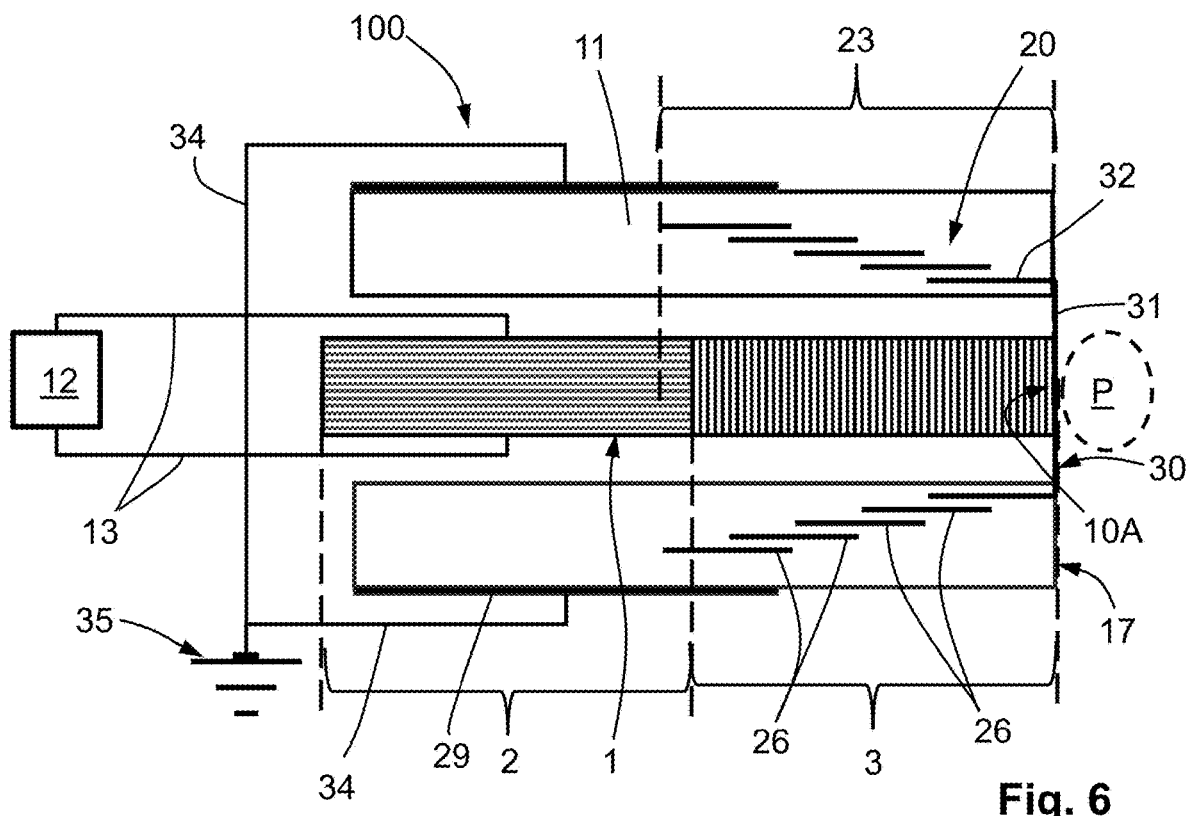
FIG. 6 is a schematic representation of the device for generating a high voltage or high field strength, with a means is provided in the output area which is suitable for capacitive field control.
Figure 7:
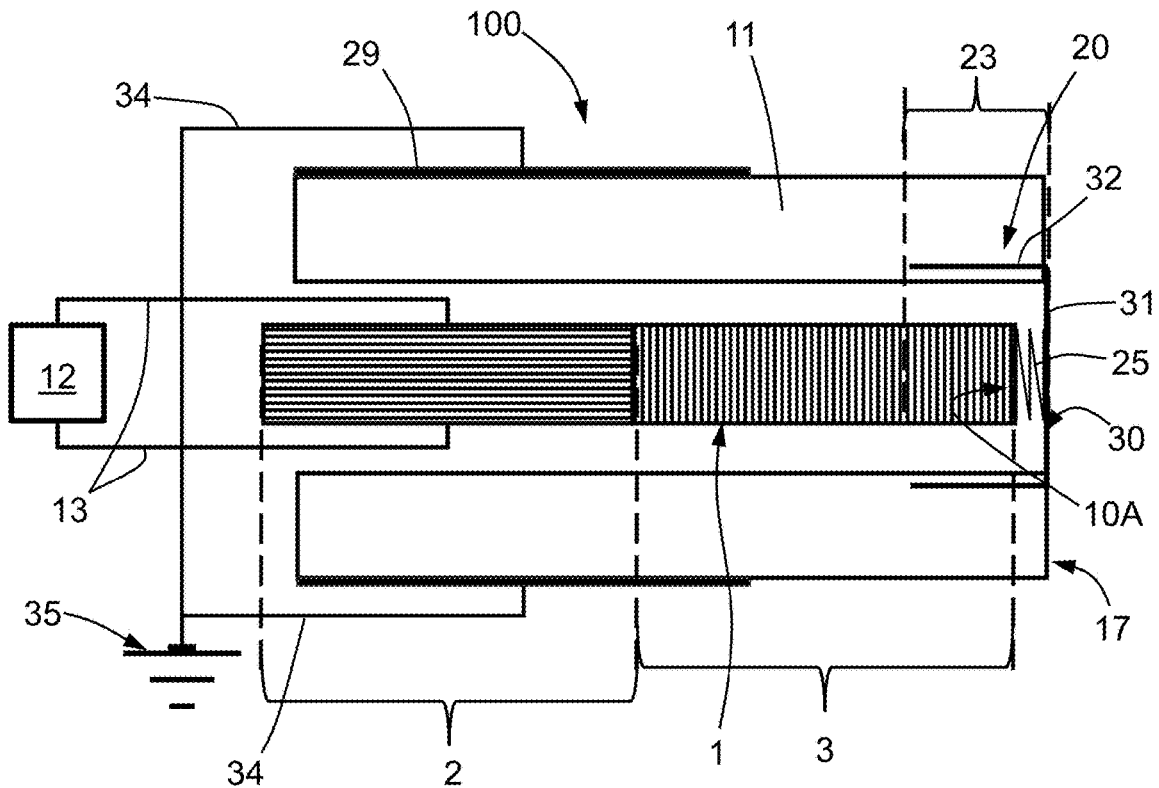
FIG. 7 is a schematic representation of the device for generating a high voltage or high field strength, with a means provided in the output area which is suitable for refractive field control with a highly refractive dielectric.
Figure 8:
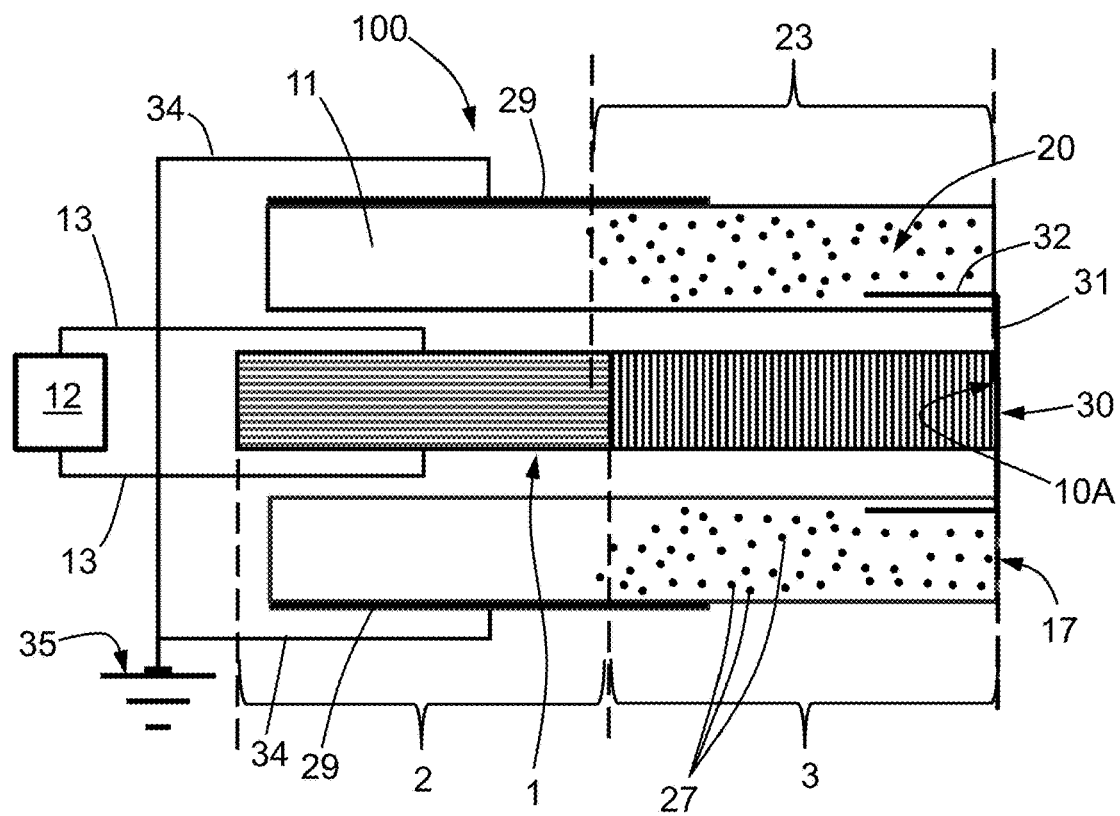
FIG. 8 is a schematic representation of the device for generating a high voltage or high field strength, with a means provided in the output area which is suitable for resistive and/or capacitive field control via a degree of filling in the housing.

FIG. 6 shows a schematic representation of the device 100 for generating a non-thermal atmospheric pressure plasma P. In the output area 3 of the device 100, a means 20 is provided which is suitable for capacitive field control in the output area 3 of the device 100. As shown in FIGS. 6 to 8, the piezoelectric transformer 1, which has an input region 2 and an output region 3, extends in a cylindrical, dielectric housing 11. The piezoelectric transformer 1 is thus surrounded along its longitudinal direction L by a cylindrical, dielectric housing 11. A control electronics 12 of the device 100 is provided for supplying the piezoelectric transformer 1 with AC voltage and is connected by electrical lines 13 with an outer electrode 8 on a first side surface 6 of the input area 2 (not shown) and an outer electrode 8 on a second side surface 7 of the input area 2 (not shown). As already mentioned in the description of FIG. 2, a high voltage forms on the output side end face 10A of the piezoelectric transformer 1.

A means 20 is provided in the area 23 of the cylindrical and dielectric housing 11 for field control. The means 20 is arranged such that it extends in the longitudinal direction L along the output region 3, starting from an output side end face 10A of the piezoelectric transformer 1. In this embodiment, the means 20 comprises a pot-shaped cap 30 with a base 31 and a radially circumferential edge 32. The base 31 covers the output side end face 10A of the piezoelectric transformer 1. The radially circumferential edge 32 extends in the direction of the longitudinal axis L along the region 23. Furthermore, in this embodiment, the means 20 comprises a plurality of capacitive elements 26 which are embedded in the region 23 of the cylindrical housing 11. The cup-shaped cap 30 is attached to an output-side end 17 of the cylindrical housing 11, so that the radially circumferential edge 32 of the cap 30 is embedded in the dielectric material of the cylindrical housing 11 in the region 23 and the bottom 31 of the cap 30 of the output-side end face 10A is opposite of the piezoelectric transformer 1. The cup-shaped cap 30 closes the output side end 17 of the cylindrical housing 11.

All of the embodiments of the device 100 shown in FIGS. 6 to 9 have a conductive cladding 29 on an outer wall 19 of the cylindrical housing 11, which is formed at least in the entrance area 2 (not shown). The conductive cladding 29 is connected to ground potential 35 via electrical lines 34. The control electronics 12 are connected to the external electrodes 8 (not shown here) of the input region 2 of the piezoelectric transformer 1 via a corresponding electrical line 13. Due to the high voltage generated on the output side end face 10A of the piezoelectric transformer 1, the plasma P is formed in the longitudinal direction L at the bottom 31 of the cap 30.

FIG. 7 shows a schematic representation of the device 100 for generating a non-thermal atmospheric pressure plasma P, a means 20 being provided in the exit area 3 which is suitable for refractive field control. For this purpose, the means 20 consists of a housing 11, which is made of a highly refractive dielectric. In addition, the means 20 comprises a cup-shaped cap 30, which is attached to the outlet-side end 17 of the cylindrical housing 11. The radially circumferential edge 32 of the cap 30 is embedded in the dielectric material of the cylindrical housing 11 in a defined area 23. The bottom 31 of the cap 30 is coupled to the end face 10A of the piezoelectric transformer 1 on the output side via a permanently elastic element 25. The cup-shaped cap 30 closes the output-side end 17 of the cylindrical housing 11. All other elements of the device 100 have already been mentioned in the description of FIG. 6.

FIG. 8 shows a schematic illustration of a further possible embodiment of the device 100 for generating a non-thermal atmospheric pressure plasma P. For this purpose, a means 20 is provided in the exit area 3, by means of which the field distribution 16 (see FIG. 5) of isopotential lines 16I of the electric field passes through an external influence 80 can be kept substantially constant. The means 20 effects a resistive and/or capacitive field control, which is regulated by resistive and/or capacitive fillers 27 in the material of the housing 11 in the exit area 3. The filling of the material of the housing 11 is restricted to the area 23. Here too, the means 20 comprises a cup-shaped cap 30, which is attached to the outlet-side end 17 of the cylindrical housing 11. The radially circumferential edge 32 of the cap 30 is embedded in the dielectric material of the cylindrical housing 11. The bottom 31 of the cap 30 lies opposite the output side end face 10A of the piezoelectric transformer 1 on the output side. The cup-shaped cap 30 closes the output-side end 17 of the cylindrical housing 11.

Figure 9:
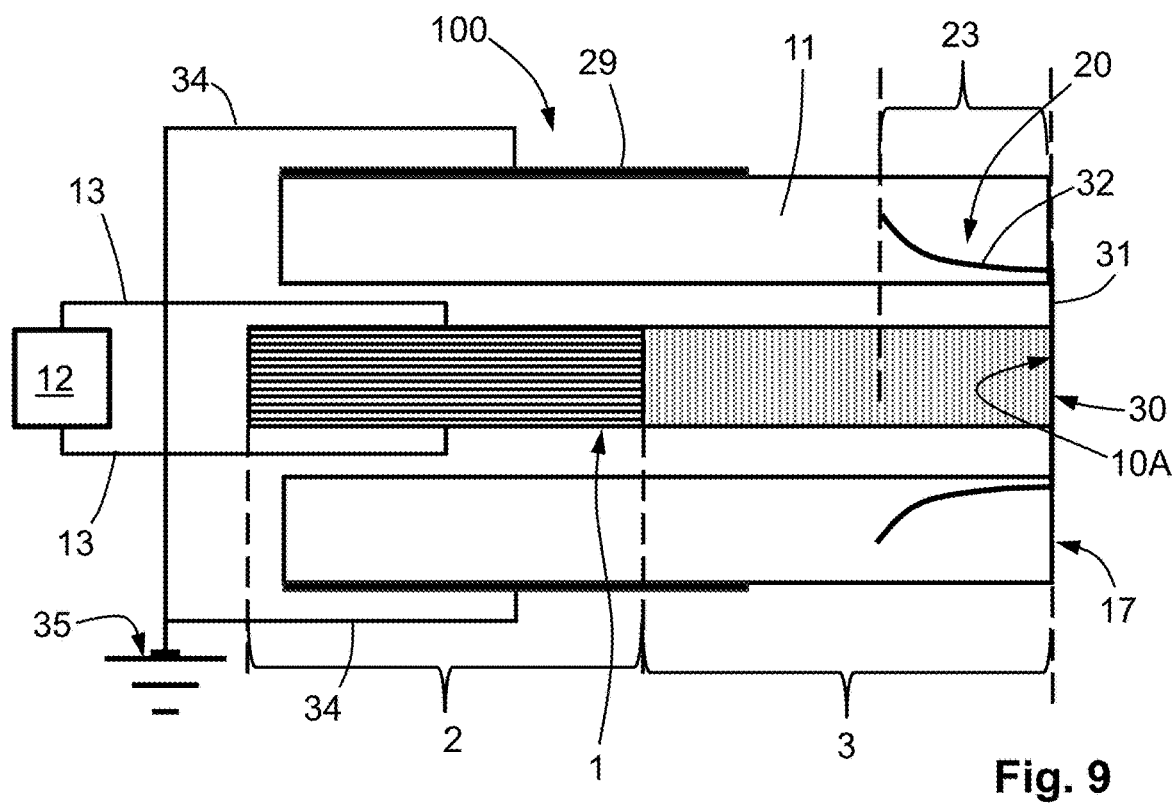
FIG. 9 is a schematic representation of the device for generating a high voltage or high field strength, wherein a means provided in the output area, which is suitable for geometric field control.

FIG. 9 shows a schematic representation of another embodiment of the device 100 according to the invention for generating a non-thermal atmospheric pressure plasma P. For this purpose, a means 20 is provided in the output area 3, which is designed in such a way that it is suitable for a geometric field control. In this embodiment, the means 20 is the cup-shaped cap 30, which is attached to the outlet-side end 17 of the cylindrical housing 11. The radially circumferential edge 32 of the cap 30 is embedded in the dielectric material of the cylindrical housing 11 in the region 23. The edge 32 is designed in such a way that it extends from the bottom 31. Here too, the bottom 31 of the cap 30 lies opposite the output side end 10A of the piezoelectric transformer 1. The cup-shaped cap 30 closes the output-side end 17 of the cylindrical housing 11.

Figure 10:
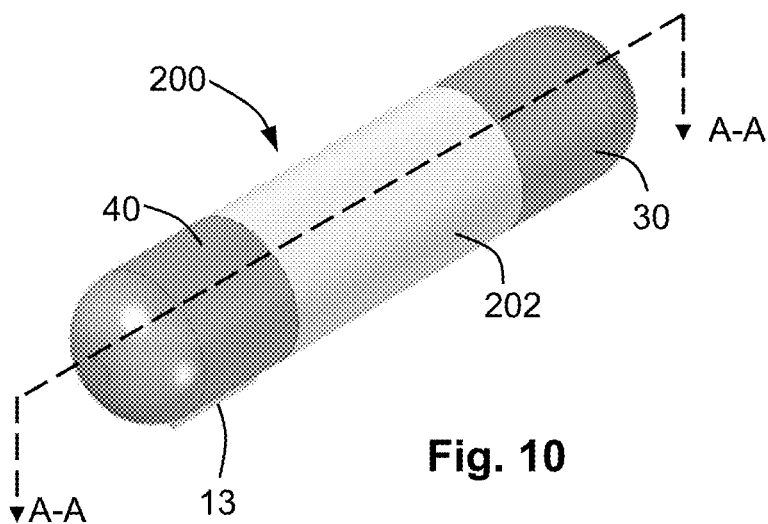
FIG. 10 is a perspective view of a device for generating a high voltage or high field strength.

FIG. 10 shows a perspective view of a component 200 for generating a non-thermal atmospheric pressure plasma P. The component 200 can be used in the device 100 according to the invention for generating a non-thermal atmospheric pressure plasma P. The component 200 comprises a cylindrical, dielectric sleeve 202, which is closed by a cap 30 at the output-side end 17 (not shown here) and by a further cap 40 at the input-side end 18 (not shown here). In each case one electrical line 13 of each outer electrode 8 of the piezoelectric transformer 1 (see FIGS. 11 and 12) is led to the outside through the dielectric sleeve 202 of the component 200.

Figure 11:
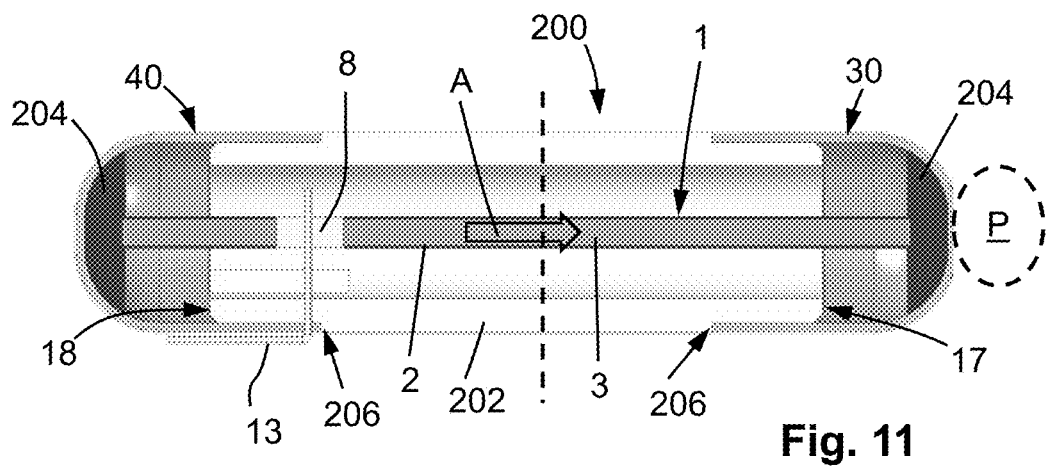
FIG. 11 is a sectional view of the device for generating a high voltage or high field strength along the section line A-A shown in FIG. 10; and, FIG. 12 is a perspective sectional view of the device for generating a high voltage or high field strength.

FIG. 11 shows a sectional view of the component 200 for generating a non-thermal atmospheric pressure plasma P along the section line A-A shown in FIG. 10. A piezoelectric transformer 1 is arranged in the interior of the dielectric sleeve 202. The piezoelectric transformer 1 extends in the axial direction A in the sleeve 202 and is arranged concentrically in the sleeve 202. The piezoelectric transformer 1 is defined by the input area 2 and the output area 3. The cap 30 is attached to the outlet end 17 of the dielectric sleeve 202. The output-side end face 10A (not shown) of the piezoelectric transformer 1 bears against the cap 30. The further cap 40 is attached to the input end 18 of the sleeve 202. The input-side end face 10E (not shown) of the piezoelectric transformer 1 bears against the further cap 40. Each of the outer electrodes 8 of the piezoelectric transformer 1 is contacted by an electrical line 13. The electrical lines 13 are led out of the sleeve 202 of the component 200 and can be contacted by the control electronics 12 (see, for example, FIGS. 6-9).

Figure 12:
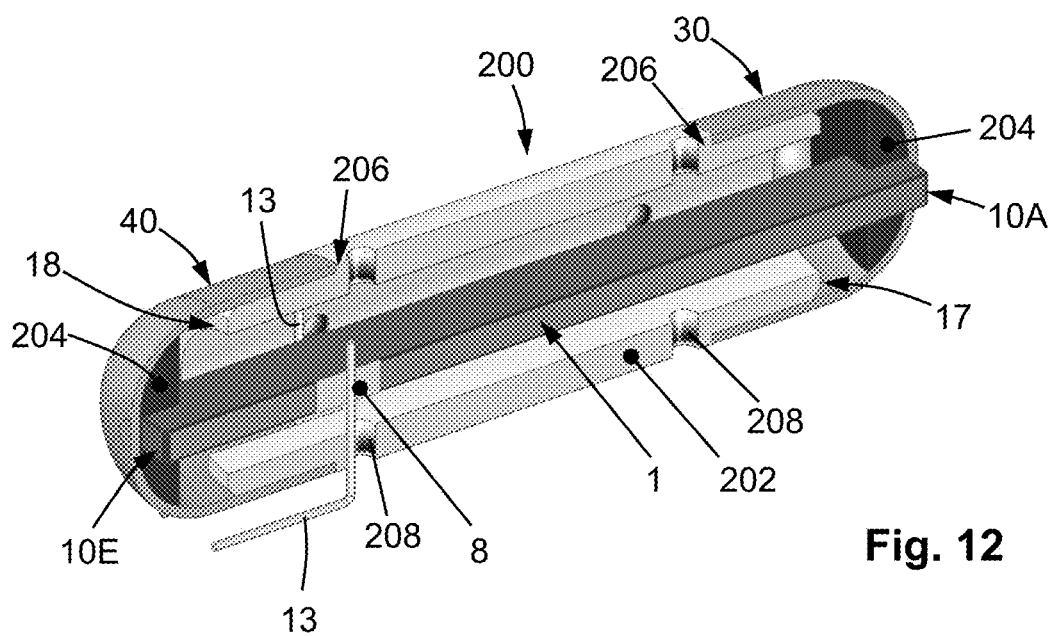

As can be seen from FIG. 11 and the perspective sectional illustration of FIG. 12 of the component 200 for generating a non-thermal atmospheric pressure plasma P, a permanently elastic element 204 is provided in the cap 30 and the further cap 40. The piezoelectric transformer 1 is held in the sleeve 202 by the permanently elastic element 204 of the cap 30 and the further cap 40. The output side end face 10A of the piezoelectric transformer 1 bears against the cap 30 and the input side end face 10E of the piezoelectric transformer 1 bears against the further cap 40.

As can also be seen from FIGS. 11 and 12, a preferred embodiment of the invention, the dielectric sleeve 202 has a radially circumferential shoulder 206 on each side defined position on the sleeve 202. The cap 30 or the further cap 40 can be attached to the shoulder 206 and can thus be brought into a defined position on the sleeve 202. The dielectric sleeve 202, according to a possible embodiment, may have formed at least one passage 208 in the sleeve 202. A pressure, temperature or moisture balance can be carried out between the interior of the sleeve 202 and the surroundings of the component 200 via the passage 208.

The combination of the field control structure (at least the first cap 30 or the appropriately designed means 20) with the mechanical, for example the elastic mounting of the piezoelectric transformer 1 lead to a practical component 200. In this embodiment, the piezoelectric transformer 1 is glued into the cap 30 (field control cap) with a permanently elastic, electrically conductive element 204. Likewise, a thermal connection of the means 20 for field control or the cap 30 can be provided in order to dissipate heat loss from the piezoelectric transformer 1. The cooling via the cap 30 or the further cap 40 can be optimized, if the caps 30 or 40 are designed as metallic caps.

The cap 30 (field control structure) and the further cap 40 serve to encapsulate the piezoelectric transformer 1 in the sleeve 202 in order to achieve dust protection or protection against contact. Furthermore, the cap 30 or the means 20 (field control structure) lead to the reduction of the electromagnetic emission.

The invention has been described in terms of preferred embodiments. However, it is self-evident for a person skilled in the art that changes and modifications can be made without leaving the scope of protection of the protection Claims below.

LIST OF REFERENCE NUMBERS

1 Piezoelectric transformer
2 Input region
3 Output region
4 Electrode
5 Piezoelectric material
6 First side surface
7 Second side surface
8 Outer electrode
9 Piezoelectric material
10A Output side end face
10E Input side end face
11 Cylindrical housing
12 Control electronics
13 Electrical line
14 Inner wall
15 Space
16 Field distribution
16I Isopotential line
17 Outlet-side end
18 Input end
19 Outer wall
20 Means
23 Defined area
25 Permanently elastic element
26 Capacitive element
27 Filler
29 Conductive cladding 30 Cap
31 Bottom
32 Radially circumferential edge
34 Electrical line
35 Ground potential
40 Further cap
41 Bottom
42 Radially circumferential edge
80 External influence
100 Device
200 Component
202 Dielectric sleeve
204 Permanently elastic element
206 Circumferential shoulder
208 Passage
A Axial direction
A-A Section line
P Plasma
X Stacking direction
Z Longitudinal direction

What is claimed is:

1. A device for generating a high voltage or high field strength, comprising:
a piezoelectric transformer with an input region and an output region;
a cylindrical, dielectric housing surrounds the piezoelectric transformer along its longitudinal direction;
a contact of a first side face and a second side surface of the input area of the piezoelectric transformer are connected via electrical lines; and
a means provided in a region of the cylindrical and dielectric housing, starting from an output-side end face of the piezoelectric transformer, and which extends at least partially in the longitudinal direction along the output region and covering the output-side end face of the piezoelectric transformer, so that in a space of the region between the piezoelectric transformer and an inner wall of the dielectric housing a symmetrical field distribution is maintained, even with an external influence, wherein a field distribution is influenced in such a way that an ignition field strength in the space of the area is avoided.

2. The device according to claim 1, wherein the means is a cup-shaped cap with a bottom and a radially circumferential edge, wherein the bottom covers the output-side end face of the piezoelectric transformer and the radially circumferential edge extends in the direction of the longitudinal axis along the region.

3. The device according to claim 2, wherein the cup-shaped cap is mounted on an output-side end of the cylindrical housing such that the radially circumferential edge of the cap, encloses the cylindrical housing in the area and the bottom of the cap is opposite the output-side end face of the piezoelectric transformer, and the cup-shaped cap closes the output-side end of the cylindrical housing.

4. The device according to claim 3, wherein a further cap is provided at an input-side end of the cylindrical housing such that a radially circumferential edge of the further cap encloses the cylindrical housing, and a bottom of the further cap is opposite an input side end face of the piezoelectric transformer, and the further cap closes the input end of the cylindrical housing.

5. The device according to claim 1, wherein control electronics are connected to the contact of the first side face and the second side surface for supplying the piezoelectric transformer with alternating voltage.

6. The device according to claim 1, wherein the means is a cup-shaped cap and is provided at an output-side end of the cylindrical housing such that the radially circumferential edge of the cap is embedded in the dielectric material of the cylindrical housing in the region, and the bottom of the cap is opposite the output-side end face of the piezoelectric transformer, and the cup-shaped cap closes the outlet end of the cylindrical housing.

7. The device according to claim 6, wherein the cylindrical housing on an outer wall has at least in the input region a conductive cladding which is at ground potential.

8. The device according to claim 1, wherein the means comprises the cup-shaped cap and a plurality of capacitive elements which are embedded in the material of the cylindrical housing in the region, the cup-shaped cap is attached to an output-side end of the cylindrical housing, so that the radially circumferential edge of the cap is embedded in the dielectric material of the cylindrical housing in the area and the bottom of the cap is opposite the output-side end face of the piezoelectric transformer, and the cup-shaped cap closes the output-side end of the cylindrical housing.

9. The device according to claim 8, wherein the cylindrical housing on an outer wall has at least in the input region a conductive cladding which is at ground potential.

10. The device according to claim 1, wherein the means comprises the cup-shaped cap and a plurality of resistive and/or capacitive fillers with which the material of the cylindrical housing is filled in the area, wherein the cup-shaped cap is provided at an outlet end of the cylindrical housing, so that the radially circumferential edge of the cap is embedded in the dielectric material of the cylindrical housing in the area and the bottom of the cap is opposite to the output-side end face, of the piezoelectric transformer, and the cup-shaped cap closes the output-side end of the cylindrical housing.

11. The device according to claim 10, wherein the cylindrical housing on an outer wall has at least in the input region a conductive cladding which is at ground potential.

12. The device according to claim 1, wherein the means is the cup-shaped cap, which is attached to an output-side end of the cylindrical housing in such a way that the radially circumferential edge of the cap is embedded in the dielectric material of the cylindrical housing in the region and is designed to widen out starting from the bottom, and the bottom of the cap is coupled with the end face on the output side of the piezoelectric transformer via a permanently elastic element, and the cup-shaped cap closes the output end of the cylindrical housing.

13. The device according to claim 12, wherein the cylindrical housing on an outer wall has at least in the input region a conductive cladding which is at ground potential.

14. A device or component for generating a high voltage or high field strength comprises:
a cylindrical sleeve made from dielectric material;
a piezoelectric transformer, arranged concentrically in the axial direction in the sleeve;
a cap which is attached to an output end of the sleeve in such a way that an output side end face of the piezoelectric transformer bears on the cap;
a further cap which is attached to an input-side end of the sleeve in such a way that an input-side end face of the piezoelectric transformer bears on the further cap; and
an elastic element, provided in the cap and the further cap, wherein in both of which the piezoelectric transformer is held.

15. The device or component according to claim 14, wherein in each case an electrical line of each contact of the piezoelectric transformer is guided through the dielectric sleeve of the component.

16. The device or component according to claim 14, wherein the dielectric sleeve has formed at the output side and the input side, a radially circumferential shoulder on which the cap and the further cap abuts and thus provides a defined positioning of the cap and the further cap on the dielectric sleeve.

17. The device or component according to claim 14, wherein at least one passage is formed in the dielectric sleeve, via which pressure, temperature or moisture compensation can be carried out.

18. The device or component according to claim 14, wherein a plasma is formed after the cap, which follows the output end of the sleeve and the output side end face of the piezoelectric transformer, outside of the cylindrical and dielectric sleeve.

\* \* \* \* \*